United States Patent

Mersten

[15] 3,649,822

[45] Mar. 14, 1972

[54] BCD TO BINARY CONVERTER

[72] Inventor: Gerald S. Mersten, Caldwell, N.J.

[73] Assignee: The Bendix Corporation

[22] Filed: Aug. 29, 1969

[21] Appl. No.: 854,078

[52] U.S. Cl. ....................................... 235/155, 340/347 DD

[51] Int. Cl. ....................................... H04l 3/00

[58] Field of Search ....................... 235/155, 92; 340/347 DD

[56] References Cited

UNITED STATES PATENTS

| | | | |
|---|---|---|---|
| 3,170,062 | 2/1965 | Boese et al. | 235/155 |
| 3,185,825 | 5/1965 | McDonald et al. | 235/155 |
| 2,411,540 | 11/1946 | Haigh | 235/155 |
| 2,729,811 | 1/1956 | Gloess | 340/347 |
| 3,524,976 | 8/1970 | Wang | 235/155 |

*Primary Examiner*—Maynard R. Wilbur
*Assistant Examiner*—Joseph M. Thesz, Jr.
*Attorney*—Ronald G. Gillespie and Plante, Arens, Hartz, Smith and Thompson

[57] ABSTRACT

A high-speed binary coded decimal to binary converter having a plurality of full adders and half adders arranged to add the binary coded decimal signals to provide the binary signals in accordance with the following equation:

$$N_{bcd} = (b_{i3}2^3 + b_{i2}2^2 + b_{i1}2^1 + b_{i0}2^0) \times 10^i + \ldots + (b_{13}2^3 + b_{12}2^2 + b_{11}2^1 + b_{10}2^0) \times 10^1 + (b_{03}2^3 + b_{02}2^2 + b_{01}2^1 + b_{00}2^0) \times 10^0 \quad (1)$$

Where $N_{bcd}$ is the binary coded decimal number, $i$ is the maximum decimal order of the decimal number, and $b$ is the binary coded decimal signal and has a logic value of 1 or 0.

5 Claims, 1 Drawing Figure

PATENTED MAR 14 1972 3,649,822
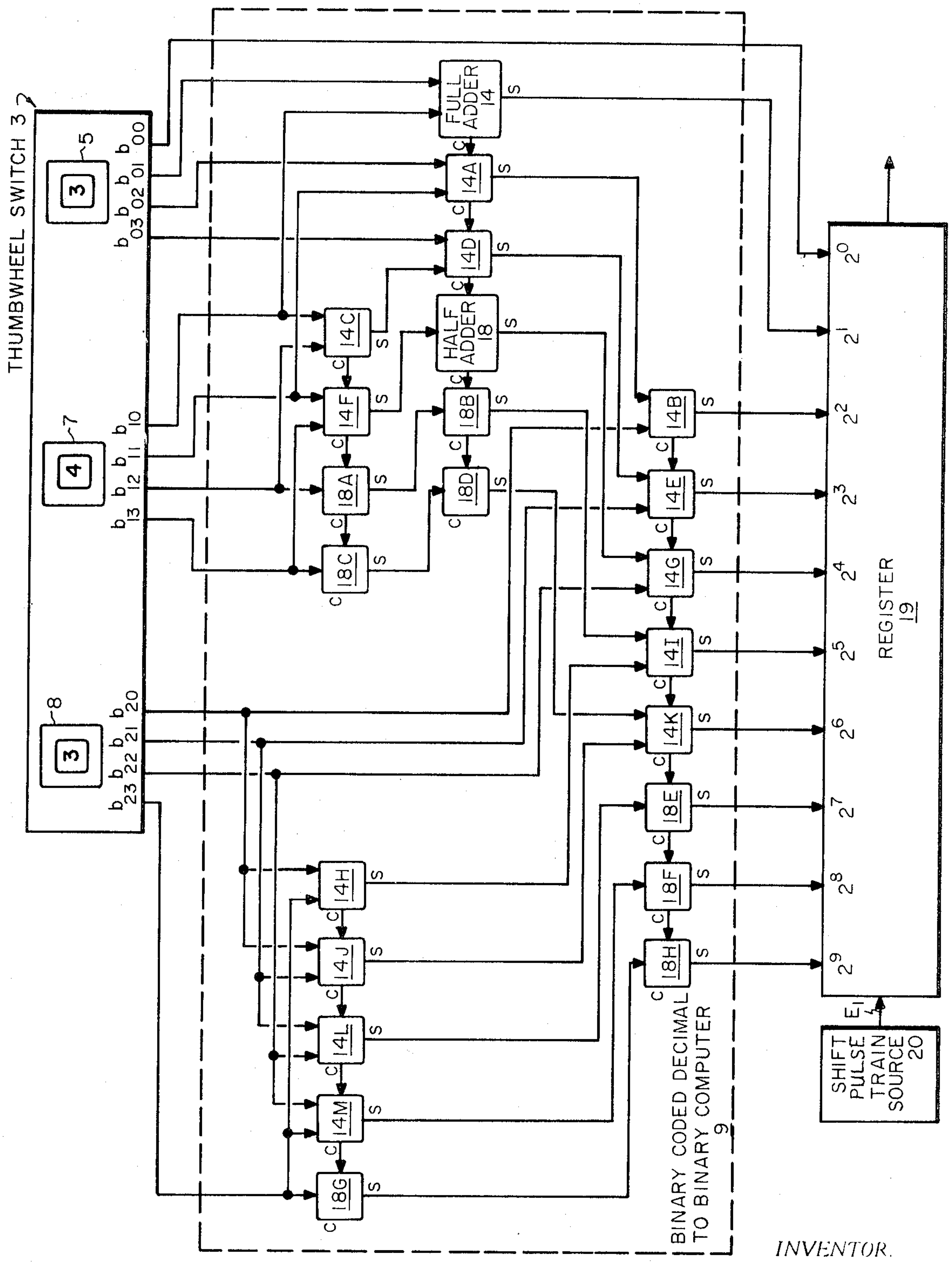
INVENTOR.
GERALD S. MERSTEN
BY Ronald G. Gillespie
ATTORNEY

BCD TO BINARY CONVERTER

BACKGROUND OF THE INVENTION

1. Field of the Invention

The present invention relates to coded converters and, more particularly, to a binary coded decimal to binary converter.

2. Description of the Prior Art

Heretofore, binary coded decimal to binary converters, such as the type disclosed in U.S. Pat. No. 3,276,013 issued Sept. 27, 1966 to G. F. Chandler, requires a conversion time corresponding to the decimal value of the binary coded decimal signals. The Chandler converter counts timing pulses with a binary counter in accordance with the counting down of binary coded decimal counters to effect the conversion. The conversion time therefore corresponds to the value of the decimal number.

Other binary coded decimal to binary converters require a conversion time corresponding to the number of binary coded decimal signals to be converted.

The present invention provides high speed conversion of binary coded decimal signals to binary signals. The conversion time corresponds directly to the response time of the parts used. The present invention further distinguishes over the Chandler converter by using only adders to accomplish the conversion.

SUMMARY OF THE INVENTION

A binary coded decimal to binary converter comprises a switch for providing binary signals $b_{i3}$, $b_{i2}$, $b_{i1}$ and $b_{i0}$ corresponding to each digit of a decimal number. A plurality of adders connected to the switch adds the binary signals in accordance with the decimal order $i$ of each digit and provides an output corresponding to the addition. A register connected to the adders provides a binary signal corresponding to the decimal number in accordance with the outputs from the adders.

One object of the present invention is to provide a high speed binary coded decimal to binary converter.

Another object of the present invention is to provide a converter in which the time to convert binary coded decimal signals to binary signals increases only slightly for a large increase in the number of binary coded decimal signals to be converted.

Another object of the present invention is to provide a binary coded decimal to binary converter which continuously converts binary coded decimal signals.

Another object of the present invention is to provide a binary coded decimal to binary converter which does not require timing pulses or circuitry for controlling the application of binary coded decimal signals to the converter.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE DRAWING

The drawing shows a novel binary coded decimal to binary converter constructed in accordance with the present invention, for converting a three digit decimal number to its equivalent binary signal.

DESCRIPTION OF THE INVENTION

For purposes of illustration, Equation (1) of the abstract is rewritten for a three digit decimal number as follows:

$$N_{bcd} = (b_{23}2^3 + b_{22}2^2 + b_{21}2^1 + b_{20}2^0) \times 10^2 + (b_{13}2^3 + b_{12}2^2 + b_{11}2^1 + b_{10}2^0) \times 10^1 + (b_{03}2^3 + b_{02}2^2 + b_{01}2^1 + b_{00}2^0) \times 10^0 \qquad (2)$$

The powers of 10 multipliers may be rewritten in binary form so that Equation (2) is now written as:

$$N_{bcd} = (b_{23}2^3 + b_{22}2^2 + b_{21}2^1 + b_{20}2^0)(2^6 + 2^5 + 2^2) + (b_{13}2^3 + b_{12}2^2 + b_{11}2^1 + b_{10}2^0)(2^3 + 2^1) + (b_{03}2^3 + b_{02}2^2 + b_{01}2^1 + b_{00}2^0)(2^0) \qquad (3)$$

After performing the indicated multiplication, Equation (3) can then be written as:

$$N_{bcd} = b_{23}2^9 + b_{23}2^8 + b_{23}2^5 + b_{22}2^8 + b_{22}2^7 + b_{22}2^4 + b_{21}2^7 + b_{21}2^6 + b_{21}2^3 + b_{20}2^6 + 0_{20}2^5 + 0_{20}2^2 + b_{13}2^6 + b_{13}2^4 + b_{12}2^5 + b_{12}2^3 + b_{11}2^4 + b_{11}2^2 + b_{10}2^3 + b_{10}2^1 + b_{03}2^3 + b_{02}2^2 + b_{01}2^1 + b_{00}2^0 \qquad (4)$$

Equation (4) is then simplified to yield:

$$N_{bcd} = b_{23}2^9 + (b_{22} + b_{23})2^8 + (b_{21} + b_{22})2^7 + (b_{13} + b_{20} + b_{21})2^6 + (b_{12} + b_{20} + b_{23})2^5 + (b_{11} + b_{13} + b_{22})2^4 + (b_{03} + b_{10} + b_{12} + b_{21})2^3 + (b_{02} + b_{11} + b_{20})2^2 + (b_{01} + b_{10})2^1 + b_{00}2^0 \qquad (5)$$

Referring to the drawing, there is shown a decimal to binary converter having a thumbwheel switch 3 providing binary coded decimal signals $b_{00}$ through $b_{23}$ corresponding to a decimal number set in switch 3 by thumbwheels 5, 7 and 8. Switch 3 applies the binary coded decimal signals to a novel binary coded decimal to binary computer 9. Computer 9 includes conventional-type full adders 14 through 14M and conventional-type half adders 18 through 18H arranged to add the binary signals from switch 3 to provide signals corresponding to different terms of Equation (5). Each full adder or half adder provides one output S corresponding to the sum and another output C corresponding to the carry. The signals from computer 9 are applied to a register 19 having $2^0$ through $2^9$ inputs.

Binary signal $b_{00}$ from switch 3 is applied directly to the $2^0$ input of register 19 by computer 9. Full adder 14 adds signals $b_{01}$ and $b_{10}$ from switch 3 and provides a corresponding signal to the $2^1$ input of register 19. Full adders 14A and 14B are connected together and to switch 3 to add signals $b_{02}$, $b_{11}$ and $b_{20}$ from switch 3. Full adder 14B applies a signal corresponding to the term $(b_{02}+b_{11}+b_{20})$ of Equation (5) to the $2^2$ input of register 19.

Full adders 14C, 14D and 14E are serially connected together and to switch 3 to add signals $b_{03}$, $b_{10}$, $b_{12}$ and $b_{21}$. Full adder 14E provides a signal corresponding to the term $(b_{03}+b_{10}+b_{12}+b_{21})$ in Equation (5), to the $2^3$ input or register 19.

A signal corresponding to the term $(b_{11}+b_{13}+b_{22})$ in Equation (5) is applied to the $2^4$ input of register 19 by full adder 14G which is connected to full adder 14F by half adder 18. Full adders 14F and 14G are also connected to switch 3 to add signals $b_{11}$, $b_{13}$ and $b_{22}$.

Signals $b_{12}$, $b_{20}$ and $b_{23}$ from switch 3 are added in accordance with the term $(b_{12}+b_{20}+b_{23})$ of Equation 5 by full adders 14H and 14I. Full adder 14H and half adder 18A are connected to switch 3. Full adder 14I is connected to full adder 14H and to half adder 18A by half adder 18B to provide a signal corresponding to the addition to the $2^5$ input of register 19.

The $2^6$ input of register 19 receives a signal from a full adder 14K corresponding to the term $(b_{13}+b_{20}+b_{21})$ of Equation (5). Full adder 14J applies a signal corresponding to the sum of signals $b_{20}$ and $b_{21}$ received from switch 3 to full adder 14K. Half adder 18C applies signal $b_{13}$ from switch 3 through half adder 18D to full adder 14K.

Full adder 14L adds signals $b_{21}$ and $b_{22}$ from switch 3 and applies a signal corresponding to the term $(b_{21}+b_{22})$ of Equation (5) through half adder 18E to the $2^7$ input of register 19. Full adder 14M adds signals $b_{22}$ and $b_{23}$ from switch 3 and applies a signal corresponding to the term $(b_{22}+b_{23})$ of Equation (5) through half adder 18F to the $2^8$ input of register 19. Half adders 18G and 18H add binary signal $b_{23}$ with carry signals from full adder 14M and half adder 18F, respectively. Half adder 18 applies a signal corresponding to the term $b_{23}$ of Equation (5) to $2^9$ input of register 19.

Full adders 14, 14A, 14D and half adders 18, 18B and 18D are serially connected to provide for the carry function of their operation. For a similar reason, full adders 14C and 14F and half adders 18A and 18C are serially connected. Full adders 14H, 14J, 14L and 14M and half adder 18G are serially connected to provide for the carry function. Similarly, full adders 14B, 14E, 14G, 14I and 14K and half adders 18E, 18F and 18H are serially connected to provide for the carry function.

A source 20 applies a shift pulse train $E_1$, on a periodic basis to register 19 to shift out the content as a serial binary signal. When parallel binary signals are desired, register 19 and source 20 may be omitted, and the signals from computer 9 may be used directly.

The following tables show the logic states of the different inputs and outputs of the indicated elements during the operation of the present invention while converting, for purpose of illustration, decimal number 343 to a binary signal corresponding to the binary number 0101010111.

Switch 3 binary coded decimal signals

| $b_{23}$ | $b_{22}$ | $b$ | $b_{20}$ | $b_{13}$ | $b_{12}$ | $b_{11}$ | $b_{10}$ | $b_{03}$ | $b_{02}$ | $b_{01}$ | $b_{00}$ |
|---|---|---|---|---|---|---|---|---|---|---|---|
| 0 | 0 | 1 | 1 | 0 | 1 | 0 | 0 | 0 | 0 | 1 | 1 |

Full adder outputs

| 14 | 14A | 14B | 14C | 14D | 14E | 14F |
|---|---|---|---|---|---|---|
| S C | S C | S C | S C | S C | S C | S C |
| 1 0 | 0 0 | 1 0 | 1 0 | 1 0 | 0 1 | 1 0 |

| 14G | 14H | 14I | 14J | 14K | 14L | 14M |
|---|---|---|---|---|---|---|
| S C | S C | S C | S C | S C | S C | S C |
| 1 0 | 1 0 | 0 1 | 0 1 | 1 0 | 0 1 | 1 0 |

Half adder outputs

| 18 | 18A | 18B | 18C | 18D | 18E | 18F | 18G | 18H |
|---|---|---|---|---|---|---|---|---|
| S C | S C | S C | S C | S C | S C | S C | S | S |
| 1 0 | 1 0 | 1 0 | 0 0 | 0 0 | 0 0 | 1 0 | 0 | 0 |

Inputs to register 10

| $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|
| 0 | 1 | 0 | 1 | 0 | 1 | 0 | 1 | 1 | 1 |

A binary coded decimal to binary converter as heretofore described is a high speed converter for which the conversion time increases only slightly for a large increase in the number of binary coded decimal signals to be converted. Furthermore, the aforementioned converter provides continuous conversion of the binary coded decimal signals and thus does not require control circuitry or timing pulses.

Although a binary coded decimal to binary converter for converting binary coded decimal signals corresponding to a three-digit decimal number has been shown, a decimal number having more or less digits may be converted by providing a converter in accordance with an equation derived from Equation (1) that is similar to Equation (5).

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A high speed binary coded decimal to binary converter, comprising:

means for providing binary coded decimal signals $b_{i3}$, $b_{i2}$, $b_{i1}$ and $b_{i0}$ corresponding to each digit of a decimal number, where $i$ is the decimal order of each digit and 0 to 3 are the decimal orders of each binary, adding means connected to the binary coded decimal signal means for adding the binary coded decimal signals in accordance with the following equation after the 10 multipliers are converted to binary form:

$$N_{bcd} = (b_{i3}2^3 + b_{i2}2^2 + b_{i1}2^1 + b_{i0}2^0) \times 10^i + \ldots + (b_{13}2^3 + b_{12}2^2 + b_{11}2^1 + b_{10}2^0) \times 10^1 + (b_{03}2^3 + b_{02}2^2 + b_{01}2^1 + b_{00}2^0) \times 10^0 \quad (1)$$

the adding means including a plurality of adders and half adders arranged to add the coefficients of each power of 2 and a carry signal from the adder of the next lower order of 2 and providing signals representing a coefficient of each power of 2 in the final binary number, said converter being constructed and arranged to operate in parallel fashion for high speed conversion, and output means connected to the adding means for providing a binary signal corresponding to the decimal number in accordance with the outputs from the adding means.

2. A converter of the kind described in claim 1 in which the binary coded decimal signal means includes means for setting the decimal number, and means connected to the setting means for converting each digit in the decimal number to binary coded decimal signals.

3. A converter of the kind described in claim 1 in which the output means includes a register, connected to the adding means, for storing the binary number and providing the binary signal corresponding to the stored binary number.

4. A binary coded decimal to binary converter comprising:

means for providing binary coded decimal signals $b_{i3}$, $b_{i2}$, $b_{i1}$ and $b_{i0}$ corresponding to each digit of a decimal number, adding means connected to the binary coded decimal signal means for adding the binary coded decimal signals in accordance with the decimal order $i$ of each digit and providing outputs corresponding thereto, output means connected to the adding means for providing a binary signal corresponding to the decimal number in accordance with the outputs from the adding means, the adding means including means for applying a binary coded signal $b_{00}$ from the binary coded decimal signal means to the output means as a binary signal corresponding to $2^0$ and including a plurality of serially connected adders connecting the binary coded decimal signal means to the output means and in which a first adder adds signals $b_{01}$ and $b_{10}$ to provide a binary carry signal and a binary signal corresponding to $2^1$, a second adder adds signals $b_{02}$, $b_{11}$ an $b_{20}$ and the carry signal from the first adder to provide a binary carry signal and a binary signal corresponding to $2^2$, a third adder adds signals $b_{03}$, $b_{10}$, $b_{12}$ and $b_{21}$ and the carry signal from the second adder to provide a binary carry signal and a binary signal corresponding to $2^3$, a fourth adder adds signals $b_{11}$, $b_{13}$ and $b_{22}$ and the carry signal from the third adder to provide a carry signal and a binary signal corresponding to $2^4$, a fifth adder adds signals $b_{12}$, $b_{20}$ and $b_{23}$ and the carry signal from the fourth adder to provide a binary carry signal and a binary signal corresponding to $2^5$, a sixth adder adds signals $b_{13}$, $b_{20}$ and $b_{21}$ and the carry signal from the fifth adder to provide a binary carry signal and a binary signal corresponding to $2^6$, a seventh adder adds signals $b_{21}$ and $b_{22}$ and the carry signal from the sixth adder to provide a binary carry signal and a binary signal corresponding to $2^7$, and an eighth adder adds signals $b_{22}$ and $b_{23}$ and the carry signal from the seventh adder to provide a binary carry signal and a binary signal corresponding to $2^8$, and a ninth adder adds signal $b_{23}$ and the carry signal from the eighth adder to provide a signal corresponding to $2^9$.

5. A converter of the kind described in claim 4 in which the first adder is a first full adder, the second adder includes second and third full adders connected to the binary coded decimal signal means, and to each other, the third full adder being also connected to output means; the third adder includes fourth, fifth and sixth full adders connected to the binary coded decimal signal means and the fifth full adder also connects the fourth full adder to the sixth full adder which is also connected to the output means; the fourth adder includes seventh and eighth full adders connected to the binary coded decimal signal means and the eighth full adder is also connected to the output means, and a first half adder connecting the seventh and eighth full adders; the fifth adder includes a ninth full adder and a second half adder connected to the binary coded decimal signal means, a 10th full adder connected to the ninth full adder and to the output means and a third half adder connecting the second half adder to the 10th full adder; the sixth adder includes an 11th full adder and a fourth half adder connected to the binary coded decimal signal means, a 12th full adder connected to the 11th full adder and to the output means, and a fifth half adder connecting the fourth half adder to the 12th full adder; the seventh adder includes a 13th full adder connected to the connecting means and a sixth half adder connecting the 13th full adder to the output means; the eighth adder includes a 14th full adder connected to the binary coded decimal signal means and a seventh half adder connecting the 14th full adder to the output means; and the ninth adder includes an eighth half adder connected to the binary coded decimal signal means and a ninth half adder connecting the eighth half adder to the output means.

* * * * *